(12) United States Patent
Cok et al.

(10) Patent No.: US 7,276,848 B2
(45) Date of Patent: Oct. 2, 2007

(54) OLED DEVICE HAVING IMPROVED LIGHT OUTPUT

(75) Inventors: Ronald S. Cok, Rochester, NY (US); Donald R. Preuss, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 317 days.

(21) Appl. No.: 11/093,243

(22) Filed: Mar. 29, 2005

(65) Prior Publication Data

US 2006/0220539 A1    Oct. 5, 2006

(51) Int. Cl.
*H05B 33/00* (2006.01)
(52) U.S. Cl. ............................ 313/504; 313/506
(58) Field of Classification Search ......... 313/501–512
See application file for complete search history.

(56) References Cited

U.S. PATENT DOCUMENTS

| | | | |
|---|---|---|---|
| 4,476,292 A | 10/1984 | Ham et al. | |
| 4,769,292 A | 9/1988 | Tang et al. | |
| 5,247,190 A | 9/1993 | Friend et al. | |
| 5,315,491 A * | 5/1994 | Spencer et al. | 362/84 |
| 5,834,893 A | 11/1998 | Bulovic et al. | |
| 5,955,837 A | 9/1999 | Horikx et al. | |
| 6,091,195 A | 7/2000 | Forrest et al. | |
| 6,630,684 B2 * | 10/2003 | Lee et al. | 257/40 |

(Continued)

FOREIGN PATENT DOCUMENTS

| | | |
|---|---|---|
| WO | 02/37568 | 5/2002 |
| WO | 02/37580 | 5/2002 |

OTHER PUBLICATIONS

C. W. Tang et al; "Electroluminescence Of Doped Organic Thin Films"; Journal Of Applied Physics; vol. 65; No. 9; May 1, 1989; pp. 3610-3616.

(Continued)

*Primary Examiner*—Ashok Patel
(74) *Attorney, Agent, or Firm*—Andrew J. Anderson; Stephen H. Shaw

(57) ABSTRACT

An organic light-emitting diode (OLED) pillaged display device, comprising: a) a substrate having a substrate thickness; b) an array of pixels comprising one or more OLED light-emitting elements, each light emitting element having a first electrode formed over the substrate, one or more layers of organic light-emitting material formed over the first electrode, and a second electrode formed over the layer(s) of organic light-emitting material to define a light-emitting area; the array of pixels having a characteristic spacing between neighboring pixels in the array, wherein the characteristic spacing is the maximum distance between corresponding points in neighboring pixels in an array dimension; c) a cover located over the substrate having a cover thickness; and d) a scattering layer located between the substrate and the cover; wherein light from the OLED light-emitting elements is emitted either through at least one of the substrate or the cover, and wherein the thickness of either the substrate or the cover through which light is emitted is less than or equal to two times the characteristic spacing.

18 Claims, 10 Drawing Sheets

U.S. PATENT DOCUMENTS

| | | |
|---|---|---|
| 6,777,871 B2 | 8/2004 | Duggal et al. |
| 6,787,796 B2 | 9/2004 | Do et al. |
| 7,084,565 B2 * | 8/2006 | Cho et al. .................. 313/504 |
| 2001/0026124 A1 | 10/2001 | Liu et al. |
| 2004/0061136 A1 | 4/2004 | Tyan et al. |
| 2004/0217702 A1 | 11/2004 | Garner et al. |

OTHER PUBLICATIONS

C. W. Tang et al; "Organic Electroluminescent Diodes"; Applied Physics Letter, vol. 51; No. 12; Sep. 21, 1987; pp. 913-915.

A. N. Safonov et al; "Modification Of Polymer Light Emission By Lateral Microstructure"; Synthetic Metals; 116; 2001; pp. 145-148.

John M. Lupton et al; "Bragg Scattering From Periodically Microstructured Light Emitting Diodes"; Applied Physics Letters; vol. 77; No. 21; Nov. 20, 2000; pp. 3340-3342.

Tetsuo Tsutsui et al; "Sharply Directed Emission In Organic Electroluminescent Diodes With An Optical-Microcavity Structure"; Applied Physics Letter, vol. 65; No. 15; Oct. 10, 1994; pp. 1868-1870.

* cited by examiner

OLED DEVICE HAVING IMPROVED LIGHT OUTPUT

FIELD OF THE INVENTION

The present invention relates to organic light-emitting diode (OLED) devices, and more particularly, to OLED device structures for improving light output.

BACKGROUND OF THE INVENTION

Organic light-emitting diodes (OLEDs) are a promising technology for flat-panel displays and area illumination lamps. The technology relies upon thin-film layers of organic materials and electrodes coated upon a substrate and encapsulated with a cover. These layers of materials have differing refractive indices. In particular, the cover and substrate typically have a lower refractive index than the thin-film layers of materials that, in turn, have a lower refractive index than transparent electrodes. As is well known, because these layers have different refractive indices, much of the light output from the light-emissive layer in the OLED is contained within the device. Because the light emission from the OLED is emitted in all directions, some of the light is emitted directly from the device, some is emitted into the device and is either reflected back out or is absorbed, and some of the light is emitted laterally and trapped and absorbed by the various layers comprising the device. In general, up to 80% of the light may be lost in this manner.

Organic light emitting devices (OLED) generally can have two formats known as small molecule devices such as disclosed in U.S. Pat. No. 4,476,292 and polymer OLED devices such as disclosed in U.S. Pat. No. 5,247,190. Either type of OLED device may include, in sequence, an anode, an organic EL element, and a cathode. The organic EL element disposed between the anode and the cathode commonly includes an organic hole-transporting layer (HTL), an emissive layer (EL) and an organic electron-transporting layer (ETL). Holes and electrons recombine and emit light in the EL layer. Tang et al. (Appl. Phys. Lett., 51, 913 (1987), Journal of Applied Physics, 65, 3610 (1989), and U.S. Pat. No. 4,769,292) demonstrated highly efficient OLEDs using such a layer structure. Since then, numerous OLEDs with alternative layer structures, including polymeric materials, have been disclosed and device performance has been improved.

Light is generated in an OLED device when electrons and holes that are injected from the cathode and anode, respectively, flow through the electron transport layer and the hole transport layer and recombine in the emissive layer. Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of EL can determine how efficiently the electrons and holes be recombined and result in the emission of light, etc. It has been found, however, that one of the key factors that limits the efficiency of OLED devices is the inefficiency in extracting the photons generated by the electron-hole recombination out of the OLED devices. Due to the high optical indices of the organic materials used, most of the photons generated by the recombination process are actually trapped in the devices due to total internal reflection. These trapped photons never leave the OLED devices and make no contribution to the light output from these devices.

A typical OLED device uses a glass substrate, a transparent conducting anode such as indium-tin-oxide (ITO), a stack of organic layers, and a reflective cathode layer. Light generated from the device is emitted through the glass substrate. This is commonly referred to as a bottom-emitting device. Alternatively, a device can include a substrate, a reflective anode, a stack of organic layers, and a top transparent electrode layer. Light generated from the device is emitted through the top transparent electrode. This is commonly referred to as the top-emitting device. In these typical devices, the index of the ITO layer, the organic layers, and the glass is about 2.0, 1.7, and 1.5 respectively. It has been estimated that nearly 60% of the generated light is trapped by internal reflection in the ITO/organic EL element, 20% is trapped in the glass substrate, and only about 20% of the generated light can actually emit from the device and perform useful functions.

Referring to FIG. 12, a prior-art bottom-emitting OLED has a transparent substrate 10, a first (transparent for bottom-emitting) electrode 12, one or more layers 14 of organic material, one of which is light-emitting, a second (reflective for bottom-emitting) electrode 16, a gap 18 and an encapsulating cover 20. The encapsulating cover 20 may be opaque and may be coated directly over the reflective electrode 16 so that no gap 18 exists. When a gap 18 does exist, it may be filled with polymer or desiccants to add rigidity and reduce water vapor permeation into the device. Light emitted from one of the organic material layers 14 can be emitted directly out of the device, through the substrate 10, as illustrated with light ray 1. Light may also be emitted and internally guided in the substrate 10 and organic layers 14, as illustrated with light ray 2. Alternatively, light may be emitted and internally guided in the layers 14 of organic material, as illustrated with light ray 3. Light rays 4 emitted toward the electrode 16 are reflected toward the substrate 10 and then follow one of the light ray paths 1, 2, or 3.

Referring to FIG. 13, a top-emitting OLED device as proposed in the prior art is illustrated having a substrate 10 (either reflective, transparent, or opaque), a first (reflective for top-emitting) electrode 12, one or more layers 14 of organic material, one of which is light-emitting, a second (transparent for top-emitting) electrode 16, a gap 18 and an encapsulating cover 20. The encapsulating cover 20 is transparent and may be coated directly over the electrode 16 so that no gap 18 exists. It has been proposed to fill the gap with polymeric or desiccating material. Such polymers and desiccants typically will have indices of refraction greater than or equal to that of the substrate 10 or encapsulating cover 20, and it is generally proposed to employ materials having indices of refraction matched to that of the encapsulating cover to reduce interlayer reflections. Light emitted from one of the organic material layers 14 can be emitted directly out of the device, through the encapsulating cover 20, as illustrated with light ray 1. Light may also be emitted and internally guided in the encapsulating cover 20 and organic layers 14, as illustrated with light ray 2. Additionally, light may be emitted and internally guided in the layers 14 of organic material, as illustrated with light ray 3. Light rays 4 emitted toward the electrode 12 are reflected toward the cover 20 and follow one of the light ray paths 1, 2, or 3. In some prior-art top-emitting embodiments, the electrode 12 may be opaque and/or light absorbing. The Figures are not drawn to scale because the organic layers 14 and electrodes 12 and 16 are so thin (on the order of 100 nm) with respect to substrate 10 and cover 20 (typically thicknesses of around 1 mm). Hence, the distance that light travels through the organic layers 14 and electrodes 12 and 16 is greatly exaggerated in the Figures.

A variety of techniques have been proposed to improve the out-coupling of light from thin-film light emitting devices. For example, diffraction gratings have been proposed to control the attributes of light emission from thin polymer films by inducing Bragg scattering of light that is guided laterally through the emissive layers; see "Modification of polymer light emission by lateral microstructure" by Safonov et al., Synthetic Metals 116, 2001, pp. 145-148, and "Bragg scattering from periodically microstructured light emitting diodes" by Lupton et al., Applied Physics Letters, Vol. 77, No. 21, Nov. 20, 2000, pp. 3340-3342. Brightness enhancement films having diffractive properties and surface and volume diffusers are described in WO0237568 A1 entitled "Brightness and Contrast Enhancement of Direct View Emissive Displays" by Chou et al., published May 10, 2002. The use of micro-cavity techniques is also known; for example, see "Sharply directed emission in organic electroluminescent diodes with an optical-microcavity structure" by Tsutsui et al., Applied Physics Letters 65, No. 15, Oct. 10, 1994, pp. 1868-1870. However, none of these approaches cause all, or nearly all, of the light produced to be emitted from the device. Moreover, such diffractive techniques cause a significant frequency dependence on the angle of emission so that the color of the light emitted from the device changes with the viewer's perspective.

Reflective structures surrounding a light-emitting area or pixel are referenced in U.S. Pat. No. 5,834,893 issued Nov. 10, 1998 to Bulovic et al. and describe the use of angled or slanted reflective walls at the edge of each pixel. Similarly, Forrest et al. describe pixels with slanted walls in U.S. Pat. No. 6,091,195 issued Jul. 18, 2000. These approaches use reflectors located at the edges of the light emitting areas. However, considerable light is still lost through absorption of the light as it travels laterally through the layers parallel to the substrate within a single pixel or light emitting area.

Scattering techniques are also known. Chou (International Publication Number WO 02/37580 A1) and Liu et al. (US 2001/0026124 A1) taught the use of a volume or surface scattering layer to improve light extraction. The scattering layer is applied next to the organic layers or on the outside surface of the glass substrate and has an optical index that matches these layers. Light emitted from the OLED device at higher than critical angle that would have otherwise been trapped can penetrate into the scattering layer and be scattered out of the device. The efficiency of the OLED device is thereby improved but still has deficiencies as explained below.

U.S. Pat. No. 6,787,796 entitled "Organic electroluminescent display device and method of manufacturing the same" by Do et al issued 20040907 describes an organic electroluminescent (EL) display device and a method of manufacturing the same. The organic EL device includes a substrate layer, a first electrode layer formed on the substrate layer, an organic layer formed on the first electrode layer, and a second electrode layer formed on the organic layer, wherein a light loss preventing layer having different refractive index areas is formed between layers of the organic EL device having a large difference in refractive index among the respective layers. US 2004/0217702 entitled "Light extracting designs for organic light emitting diodes" by Garner et al., similarly discloses use of microstructures to provide internal refractive index variations or internal or surface physical variations that function to perturb the propagation of internal waveguide modes within an OLED. When employed in a top-emitter embodiment, the use of an index-matched polymer adjacent the encapsulating cover is disclosed.

However, scattering techniques, by themselves, cause light to pass through the light-absorbing material layers multiple times where they are absorbed and converted to heat. Moreover, trapped light may propagate a considerable distance laterally through the cover, substrate, or organic layers before being scattered out of the device, thereby reducing the sharpness of the device in pillaged applications such as displays. For example, as illustrated in FIG. 14, a prior-art pillaged bottom-emitting OLED device may include a plurality of independently controlled pixels 30 and a scattering layer 22 located between the transparent first electrode 12 and the substrate 10. A light ray 5 emitted from the light-emitting layer 14 may be scattered multiple times while traveling through the substrate 10, organic layer(s) 14, and transparent first electrode 12 before it is emitted from the device. When the light ray 5 is finally emitted from the device, the light ray 5 may have traveled a considerable distance through the various device layers from the original pixel location where it originated to a remote pixel where it is emitted, thus reducing sharpness. Also, the amount of light emitted is reduced due to absorption of light in the various layers. Referring to FIG. 15, in a top-emitter configuration of a prior-art scattering OLED device light ray 5 travels through the cover in a manner analogous to the light ray 5 traveling through the substrate in FIG. 14. Note that because the organic layer(s) 14 are very thin relative to the substrate 10, cover, 20, and scattering layer 22, the light rays travel only a relatively insignificant distance through the organic layer(s) 14 and electrode 16.

Light-scattering layers used externally to an OLED device are described in U.S. Pat. No. 5,955,837 entitled "System with an active layer of a medium having light-scattering properties for flat-panel display devices" by Horikx, et al. This disclosure describes a scattering layer located on a substrate. Likewise, U.S. Pat. No. 6,777,871 entitled "Organic ElectroLuminescent Devices with Enhanced Light Extraction" by Duggal et al., describes the use of an output coupler comprising a composite layer having specific refractive indices and scattering properties. While useful for extracting light, this approach will only extract light that propagates in the substrate (illustrated with light ray 2) and will not extract light that propagates through the organic layers and electrodes (illustrated with light ray 3). Moreover, if applied to display devices, this structure will decrease the perceived sharpness of the display. Referring to FIG. 17, the sharpness of an active matrix OLED device employing a light-scattering layer coated on the substrate is illustrated. The average MTF (sharpness) of the device (in both horizontal and vertical directions) is plotted for an OLED device with the light-scattering layer and without the light scattering layer. As is shown, the device with the light-scattering layer is much less sharp than the device without the light scattering layer, although more light was extracted (not shown) from the OLED device with the light-scattering layer.

US 2004/0061136 entitled "Organic light emitting device having enhanced light extraction efficiency" by Tyan et al., describes an enhanced light extraction OLED device that includes a light scattering layer. In certain embodiments, a low index isolation layer (having an optical index substantially lower than that of the organic electroluminescent element) is employed adjacent to a reflective layer in combination with the light scattering layer to prevent low angle light from striking the reflective layer, and thereby minimize absorption losses due to multiple reflections from the reflective layer. The particular arrangements, however, may still result in reduced sharpness of the device.

There is a need therefore for an improved organic light-emitting diode device structure that avoids the problems noted above and improves the efficiency, sharpness, and brightness of the device.

SUMMARY OF THE INVENTION

In accordance with one embodiment, the present invention is directed towards a flat-panel, organic light-emitting diode (OLED) pillaged display device, comprising: a) a substrate having a substrate thickness; b) an array of pixels comprising one or more OLED light-emitting elements, each light emitting element having a first electrode formed over the substrate, one or more layers of organic light-emitting material formed over the first electrode, and a second electrode formed over the layer(s) of organic light-emitting material to define a light-emitting area; the array of pixels having a characteristic spacing between neighboring pixels in the array, wherein the characteristic spacing is the maximum distance between corresponding points in neighboring pixels in an array dimension; c) a cover located over the substrate having a cover thickness; and d) a scattering layer located between the substrate and the cover; wherein light from the OLED light-emitting elements is emitted either through either the substrate or the cover, and wherein the thickness of either the substrate or the cover through which light is emitted is less than or equal to two times the characteristic spacing.

ADVANTAGES

The present invention has the advantage that it increases the light output from, and improves the sharpness of, an OLED device.

It will be understood that the figures are not to scale since the individual layers are too thin and the thickness differences of various layers too great to permit depiction to scale.

DETAILED DESCRIPTION OF THE INVENTION

Figure 1:
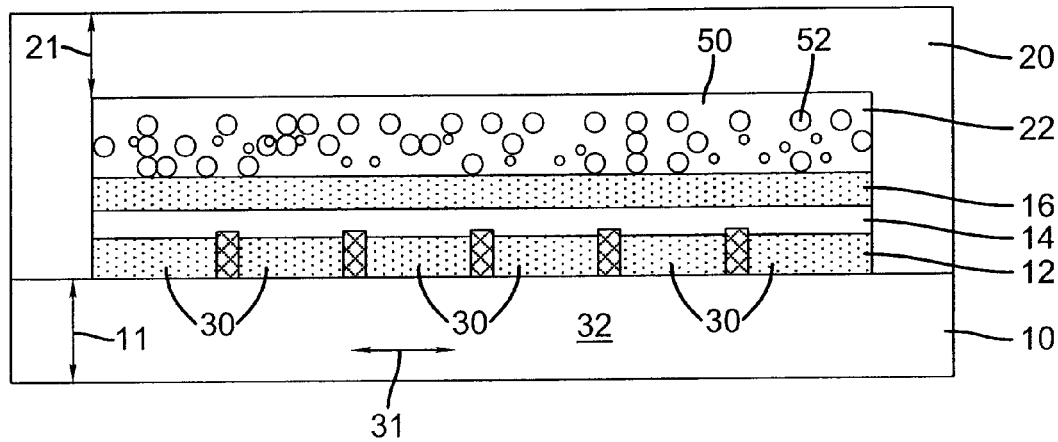
FIG. 1 illustrates a cross section of a an OLED device having a plurality of independently controlled light-emitting areas according to one embodiment of the present invention.

Referring to FIG. 1, a flat-panel, organic light-emitting diode (OLED) pixellated display device according to an embodiment of the present invention comprises a substrate 10 having a substrate thickness 11; an array of pixels 30 comprising OLED light-emitting elements, each light-emitting element having a first electrode 12 formed over the substrate 10, one or more layers of organic light-emitting material 14 formed over the first electrode 12, and a second electrode 16 formed over the layer(s) of organic light-emitting material 14 to define a light-emitting area 32; the array of pixels having a characteristic spacing 31 between neighboring pixels in the array, wherein the characteristic spacing 31 is the maximum distance between corresponding points in neighboring pixels in an array dimension; a cover 20 located over the substrate 10 having a cover thickness 21; and a scattering layer 22 located between the substrate 10 and the cover 20; wherein light from the OLED light-emitting elements is emitted either through either the substrate 10 or the cover 20, and wherein the thickness 11 or 21 of either the substrate 10 or cover 20 through which light is emitted is less than or equal to two times the characteristic spacing 31.

In preferred embodiments, the encapsulating cover 20 and substrate 10 may comprise glass or plastic with typical refractive indices of between 1.4 and 1.6. The encapsulating cover 20 and substrate 10 may be flexible or rigid. To allow light emitted by organic light-emitting material 14 to be emitted from the device, at least one of the electrodes 12 or 16 must be transparent, while the other is preferably reflective. As used herein, a transparent electrode is one that passes some light and includes electrodes that are semi-transparent, partially reflective, or partially absorptive. If reflective, the electrodes 12 or 16 are preferably made of metal (for example aluminum, silver, or magnesium) or metal alloys. If transparent, the electrodes 12 and/or 16 are preferably made of transparent conductive materials, for example indium tin oxide (ITO) or other metal oxides. The organic material layers 14 may comprise organic materials known in the art, for example, hole-injection, hole-transport, light-emitting, electron-injection, and/or electron-transport layers. Such organic material layers are well known in the OLED art. The organic material layers 14 typically have a refractive index of between 1.6 and 1.9, while indium tin oxide has a refractive index of approximately 1.8-2.1. Hence, the various layers 14 and a transparent electrode in the OLED typically have a refractive index range of 1.6 to 2.1. Of course, the refractive indices of various materials may be dependent on the frequency of light passing through them, so the refractive index values cited here for these materials are only approximate and provided as examples.

Figure 2:
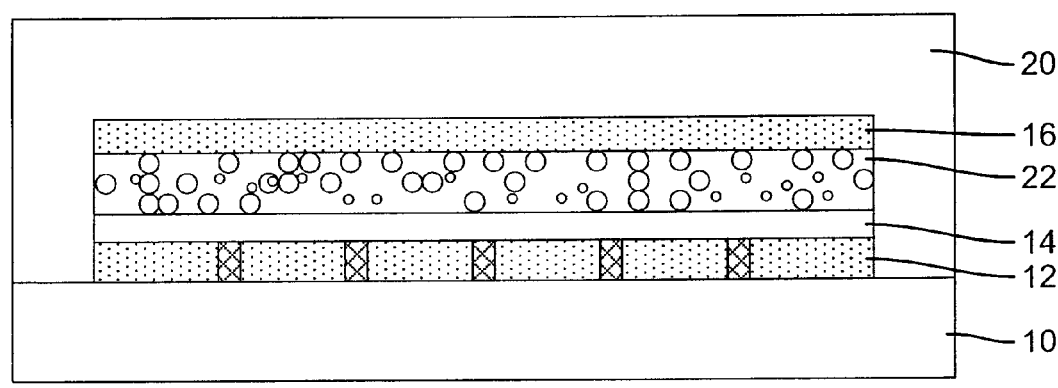
FIG. 2 illustrates a cross section of an OLED device having a plurality of independently controlled light-emitting areas according to an alternative embodiment of the present invention.
Figure 3:
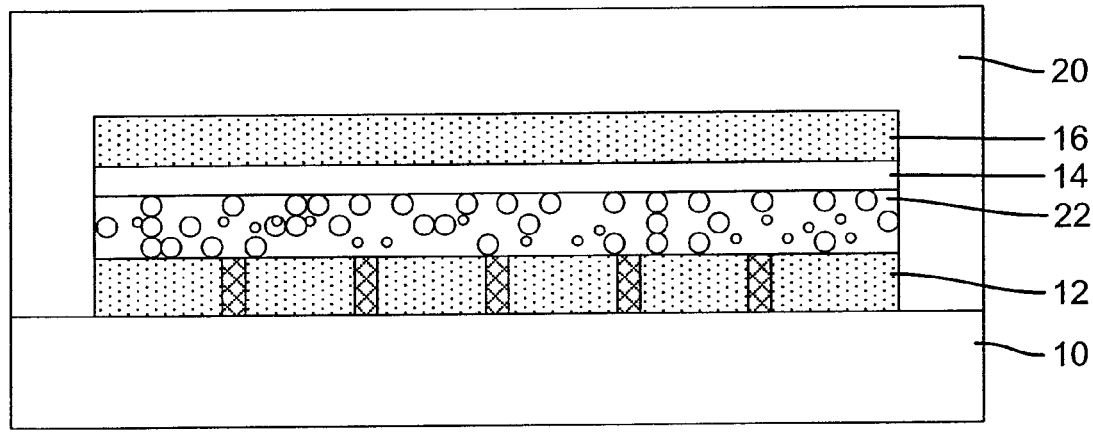
FIG. 3 illustrates a cross section of an OLED device having a plurality of independently controlled light-emitting areas according to another embodiment of the present invention.
Figure 4:
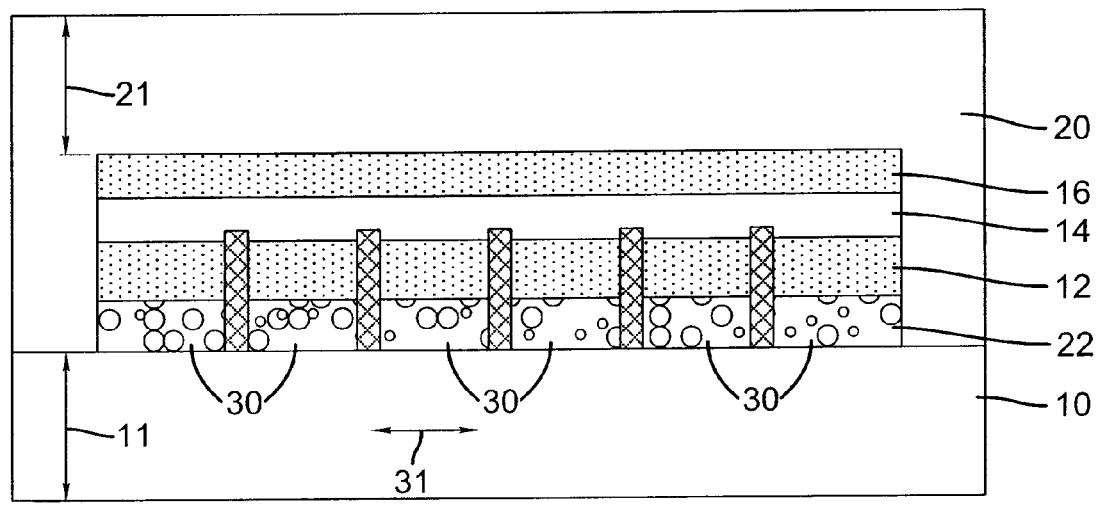
FIG. 4 illustrates a cross section of an OLED device having a plurality of independently controlled light-emitting areas according to yet another embodiment of the present invention.

When the first electrode 12 is reflective and the second electrode 16 is transparent, the arrangements of the embodiments shown in FIGS. 1, 2, and 3 may be employed in a top-emitting OLED device configuration. Alternatively, if the first electrode 12 is transparent while the second electrode 16 is reflective, the arrangements of the embodiments shown in FIGS. 2, 3, and 4 may be employed in a bottom-emitting OLED device configuration. FIG. 4 has separate light-emitting areas comparable to those of FIG. 1. If all of the elements 10-20 are transparent, the OLED device may emit light through both the substrate 10 and the cover 20.

The scattering layer 22 can take a variety of forms. For example, scattering layer 22 may comprise a volume scattering layer or a surface scattering layer. In certain embodiments, e.g., a transparent scattering layer 22 may be employed that comprises materials 50 and 52 having at least two different refractive indices. The scattering layer 22 may comprise, e.g., a matrix of lower refractive index and scattering elements have a higher refractive index. Alternatively, the matrix may have a higher refractive index and the scattering elements may have a lower refractive index. For example, the matrix may comprise silicon dioxide or crosslinked resin having a relatively low index of approximately 1.5, or silicon nitride with a much higher index of refraction.

Materials of the light scattering layer 22 can include organic materials (for example polymers) or inorganic materials. The organic materials may include one or more selected from the group consisting of PEDOT, PET, PSS, latex, or PEN. The inorganic materials may be at least one selected from the group consisting of $SiO_x$ (x>1), $SiN_x$ (x>1), $Si_3N_4$, $TiO_2$, MgO, ZnO, $Al_2O_3$, $SnO_2$, $In_2O_3$, $MgF_2$, and $CaF_2$. The scattering layer 22 may comprise, for example, silicon oxides and silicon nitrides having a refractive index of 1.6 to 1.8 and doped with titanium dioxide having a refractive index of 2.3 to 3. Polymeric materials having refractive indices in the range of 1.4 to 1.6 may be employed having a dispersion of refractive elements of material with a higher refractive index, for example titanium dioxide.

The difference in refractive indices between materials 50 and 52 in the scattering layer 22 may be, for example, from 0.3 to 3, and a large difference is generally desired. In a particular embodiment, randomly located spheres of titanium dioxide may be employed in a matrix of polymeric material forming the materials 50 and 52 of differing refractive indices. Alternatively, a more structured arrangement employing ITO, silicon oxides, or silicon nitrides may be used. Shapes of refractive elements may be cylindrical, rectangular, or spherical, but it is understood that the shape is not limited thereto. The thickness of the scattering layer may be, for example, 0.03 to 50 μm. It is generally preferred to avoid diffractive effects in the scattering layer. Such effects may be avoided, for example, by locating materials randomly or by ensuring that the sizes or distribution of the refractive elements are not the same as the wavelength of the color of light emitted by the device from the light-emitting area. If scattering layer 22 has a thickness greater than one-tenth part of the wavelength of the emitted light, then it is desirable for the index of refraction of at least one material in the scattering layer 22 to be approximately equal to or greater than the refractive indices of the organic layers 14 and/or transparent electrode layers. This is to insure that all of the light trapped in the organic layers 14 and transparent electrode can experience the direction altering effects of scattering layer 22. If scattering layer 22 has a thickness less than one-tenth part of the wavelength of the emitted light, then the materials in the scattering layer need not have such a preference for their refractive indices. The scattering layer 22 preferably has a transmissivity as high as possible, for example greater than 80%, and more preferably greater than 90% or more, so as to reduce the loss of light generated from the organic layer 14.

In an alternative embodiment, scattering layer 22 may comprise particles deposited on another layer, e.g., particles of titanium dioxide may be coated over a transparent electrode to scatter light. Preferably, such particles are at least 100 nm in diameter to optimize the scattering of visible light. In a further alternative, scattering layer 22 may comprise a rough, diffusely reflecting surface or a rough, diffusely refracting surface of an electrode itself, or refractive materials may be incorporated into the electrode itself so that the electrode acts as a scattering layer.

Conventional lithographic means can be used to create the scattering layer using, for example, photo-resist, mask exposures, and etching as known in the art. Alternatively, coating may be employed in which a liquid, for example polymer having a dispersion of titanium dioxide, may form a scattering layer 22.

The scattering layer 22 is typically adjacent to and in contact with, or close to, an electrode to defeat total internal reflection in the organic layers 14 and electrodes 12 and/or 16 (depending on which electrode is reflective). However, if the scattering layer 22 is between the electrodes 12 and 16, it may not be necessary for the scattering layer to be in contact with an electrode 12 or 16 so long as it does not unduly disturb the generation of light in the OLED layers 14. According to an embodiment of the present invention, light emitted from the organic layers 14 can waveguide along the organic layers 14 and transparent electrode combined, since the organic layers 14 have a refractive index lower than that of the transparent electrode. The scattering layer 22 disrupts the total internal reflection of light in the combined organic layers 14 and transparent electrode and redirects some portion of the light out of the combined layers.

It is important to note that a scattering layer will also scatter light that would have been emitted out of the device back into the layers 14, exactly the opposite of the desired effect. Hence, the use of optically transparent layers that are as thin as possible is desired in order to extract light from the device with as few reflections as possible.

Figure 5:
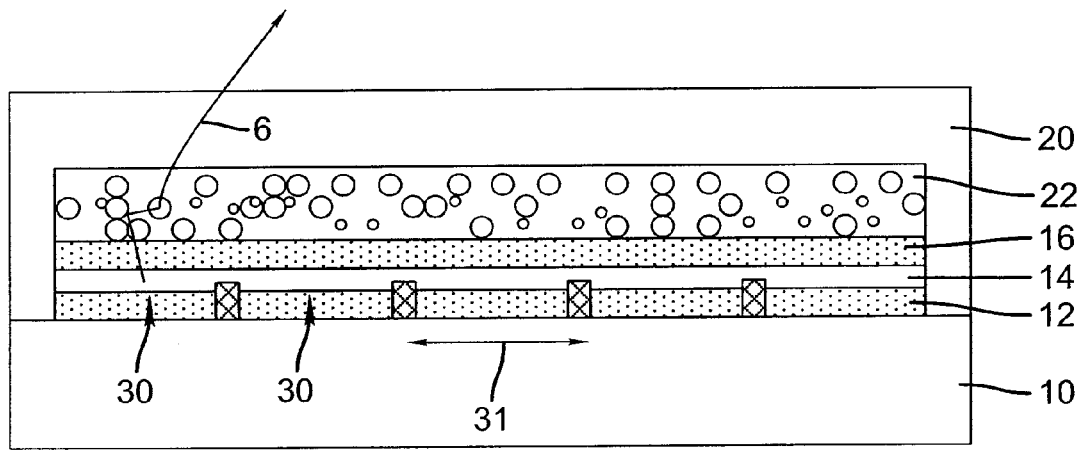
FIG. 5 illustrates light emission from a device of the type of FIG. 1.
Figure 6:
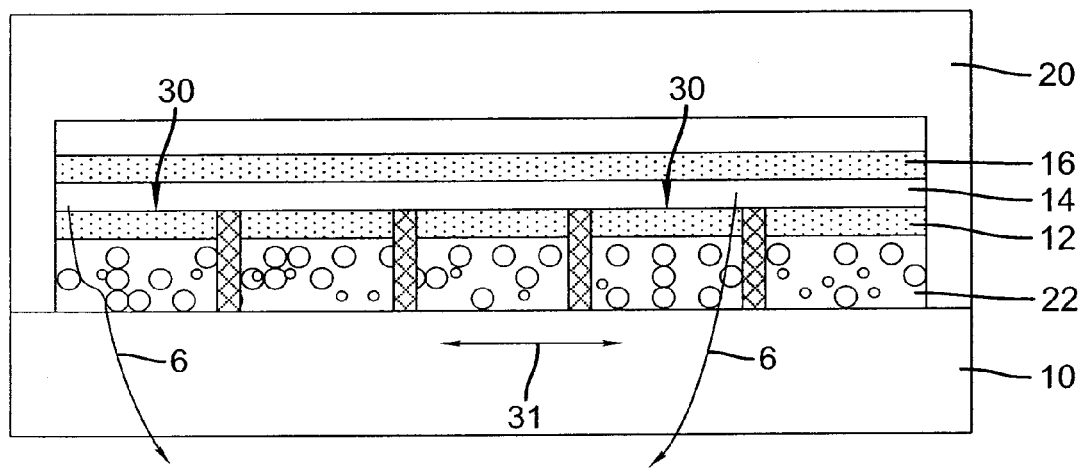
FIG. 6 illustrates light emission from a device of the type of FIG. 4.

The present invention improves over the prior art because the distance that scattered light travels in the encapsulating cover 20 or substrate 10 is reduced. Referring to FIG. 5 in a top-emitter embodiment, after light ray 6 (indicated by the segmented arrow here and in FIG. 6) is scattered into an angle that allows it to escape from the organic layers 14 and transparent second electrode 16, it travels a shorter distance through the encapsulating cover 20 because of the limitations in relative thickness of the cover according to the present invention. Referring to FIG. 6 in a bottom-emitter embodiment, after light ray 6 is scattered into an angle that allows it to escape from the organic layers 14 and transparent first electrode 12, it travels a shorter distance through the substrate 10 for the same reason. This shorter distance will both increase the sharpness of the OLED device (since light is emitted from the device closer to the point at which the light was created) and increase the light output (since less light will be absorbed by the substrate 10 or encapsulating cover 20).

Light will also be scattered into, and out of, the organic layers 14 and transparent electrode by the scattering layer 22. Applicant has determined that, in fact, light is absorbed in the organic layers 14 and transparent electrode. Hence, light traveling through these layers must be scattered out as quickly as possible. If the scattering elements in the scattering layer 22 are sufficiently close together, light traveling in the organic layers 14 and transparent electrode will be scattered before much light is absorbed, enhancing the light output. If the scattering elements are less than five microns apart, more preferably less than one micron apart, and even more preferably less than 0.5 microns apart, light can be effectively scattered before it is substantially absorbed.

The characteristic spacing 31 between pixels comprised of light-emitting elements, as defined herein, is the maximum distance between corresponding points in neighboring pixels in an array dimension. An array dimension is the direction, typically x and y or horizontal and vertical in which pixels comprised of light-emitting elements, or of groups of differently colored light-emitting elements, are repeatedly and regularly formed over the substrate 10. If an OLED device is a monochrome device in which every light-emitting element is identical, each light-emitting element forms its own pixel. Hence, in this embodiment the characteristic spacing 31 includes the length of a light-emitting area 32 in an array dimension and any spacing between light-emitting areas 32 in the same dimension. If an OLED device is a color device, having a plurality of different sub-pixel areas that emit light in different colors to form a multi-color pixel, the characteristic spacing is the larger of the distance from one light-emitting area emitting light of one color of light to the corresponding light-emitting area emitting the same color of light in a neighboring pixel in any array dimension. Since light-emitting areas often have aspect ratios not equal to one (i.e. the length and height are not the same) or are not rectangular (or rectilinear), the characteristic spacing is taken to be the largest spacing in any array dimension.

Figure 7:
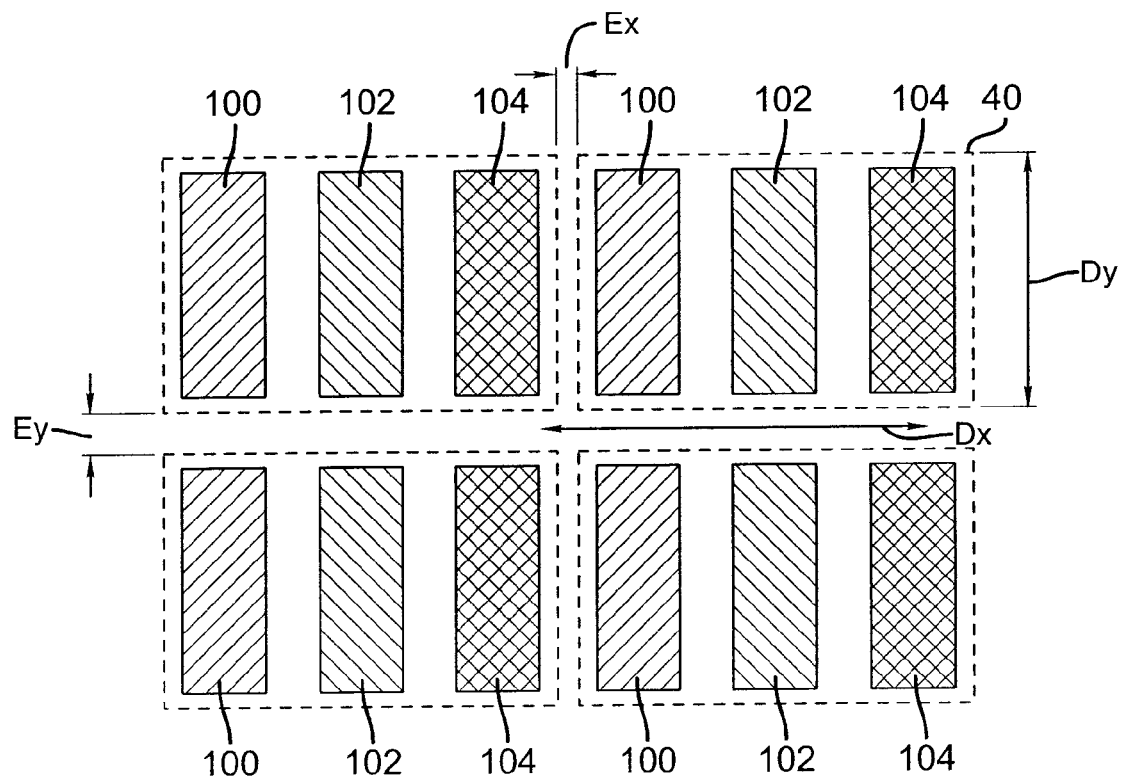
FIG. 7 is a top view of a plurality of pixels comprising differently colored light-emitting areas according to an embodiment of the present invention.

Referring to FIG. 7, for example, a color OLED device has pixels 40 comprised of red, green, and blue light-emitting areas 100, 102, and 104, respectively, which do not overlap. The spacing between neighboring pixels in the x dimension is indicated by Dx and is the distance from a point in a light-emitting area of a first pixel to the comparable point in a light-emitting area that emits the same color light in a neighboring second pixel in the x direction. In the case of the x dimension, this distance includes the light-emitting areas emitting light of different colors. The spacing between neighboring pixels in the y dimension is indicated by Dy and is the distance from a point in a light-emitting area of the first pixel to the comparable point in a light-emitting area that emits light of the same color in a neighboring second pixel in the y direction. In the case of the y dimension, the light-emitting areas that emit light of the same color are immediately neighboring, and the pixel spacing in the y dimension does not include the areas emitting light of different colors. The characteristic spacing 31 for this arrangement is the larger of Dx or Dy.

Figure 8:
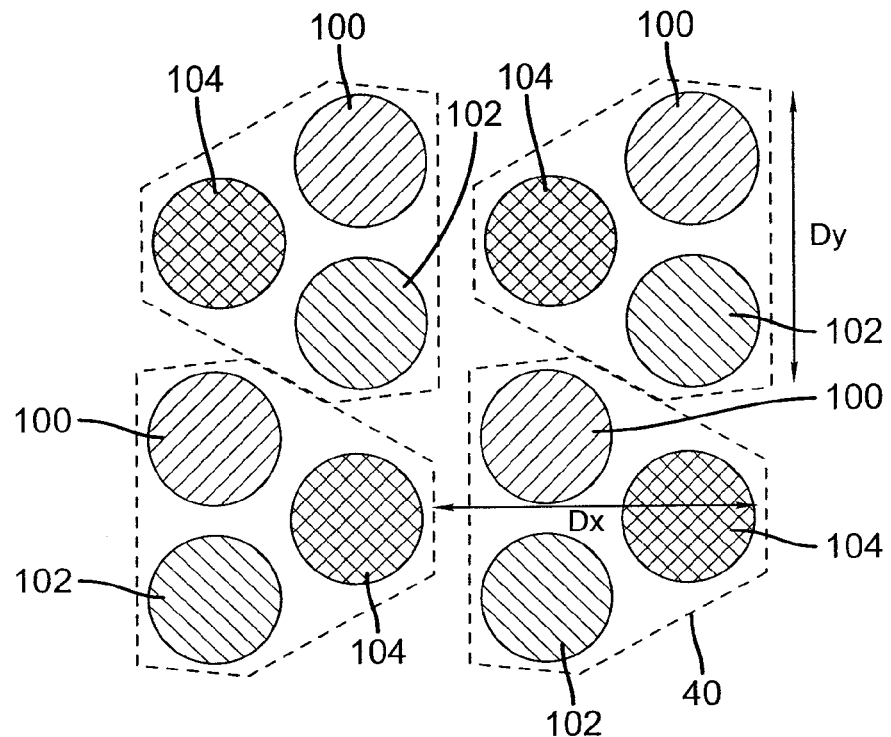
FIG. 8 is a top view of a plurality of pixels comprising differently colored light-emitting areas according to an alternative embodiment of the present invention.

Referring to FIG. 8, the light-emitting areas need not be rectilinear or arranged in rows or columns. In this configuration, light-emitting areas are shown to be circular, with pixels 40 comprised of red, green, and blue light-emitting areas 100, 102, and 104 formed in triangles to create a delta pattern. Pixels may overlap in one or more array dimensions, for example in the y dimension as illustrated, or alternatively in the x dimension or both x and y dimensions (not shown). In any case, the calculation of the spacing between neighboring pixels is the larger of the distance from the beginning of one light-emitting element in a multi-color pixel group to the corresponding point of an equivalent second light-emitting element in a multi-color pixel group or the size of the pixel itself in any array dimension. In this arrangement, as a result of pixel overlap in the y dimension, the spacing Dy in the y dimension is the size of the three-color pixel itself in that dimension. As the pixels do not overlap in the x dimension, the spacing Dx in the x dimension is the spacing between corresponding points emitting the same color of light in neighboring pixels. In this case, the larger of Dy or Dx is the characteristic spacing 31.

Figure 16:
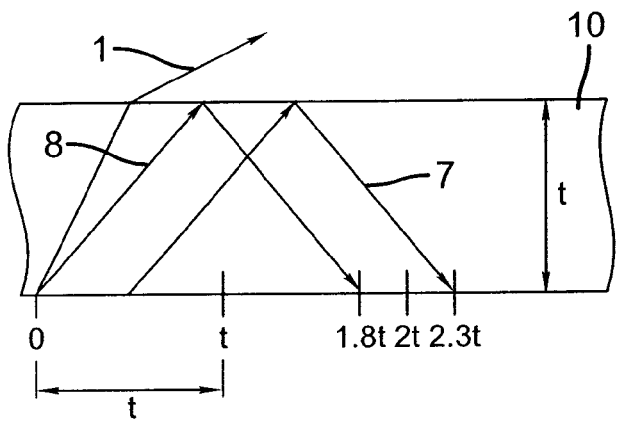
FIG. 16 illustrates light traveling through a cross section of an OLED device according to an embodiment of the present invention having a 50% fill factor.
Figure 17:
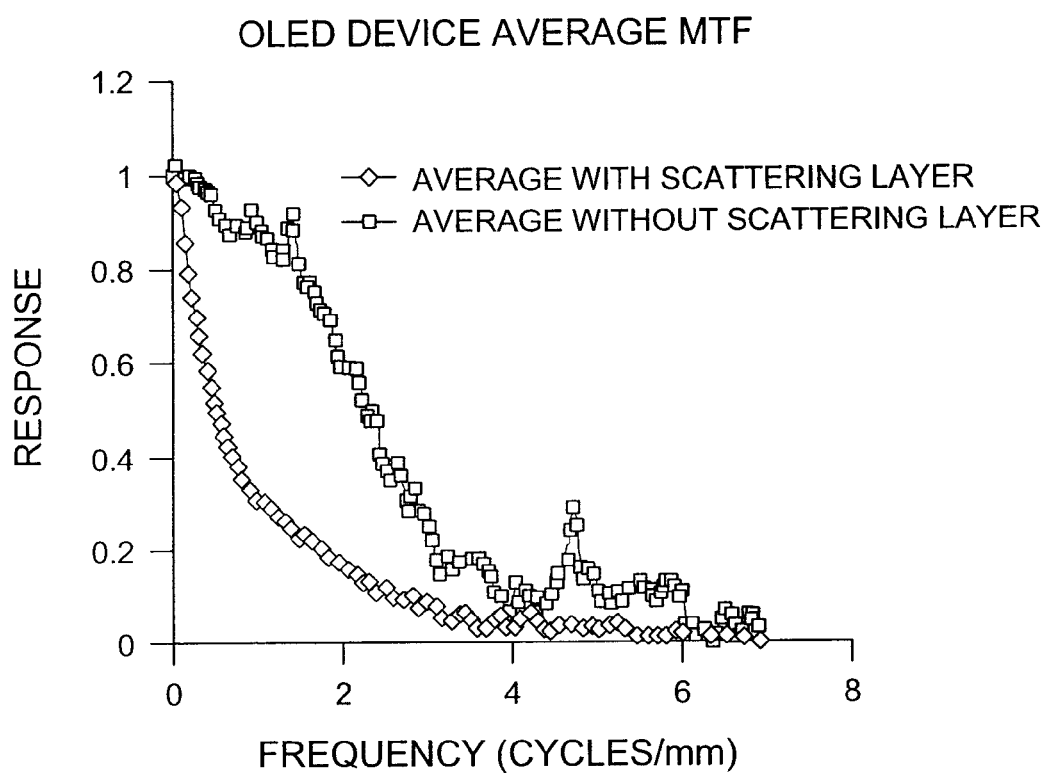
FIG. 17 is a graph demonstrating the loss in sharpness due to a scattering layer in a prior-art active-matrix bottom-emitting OLED device.
Figure 18:
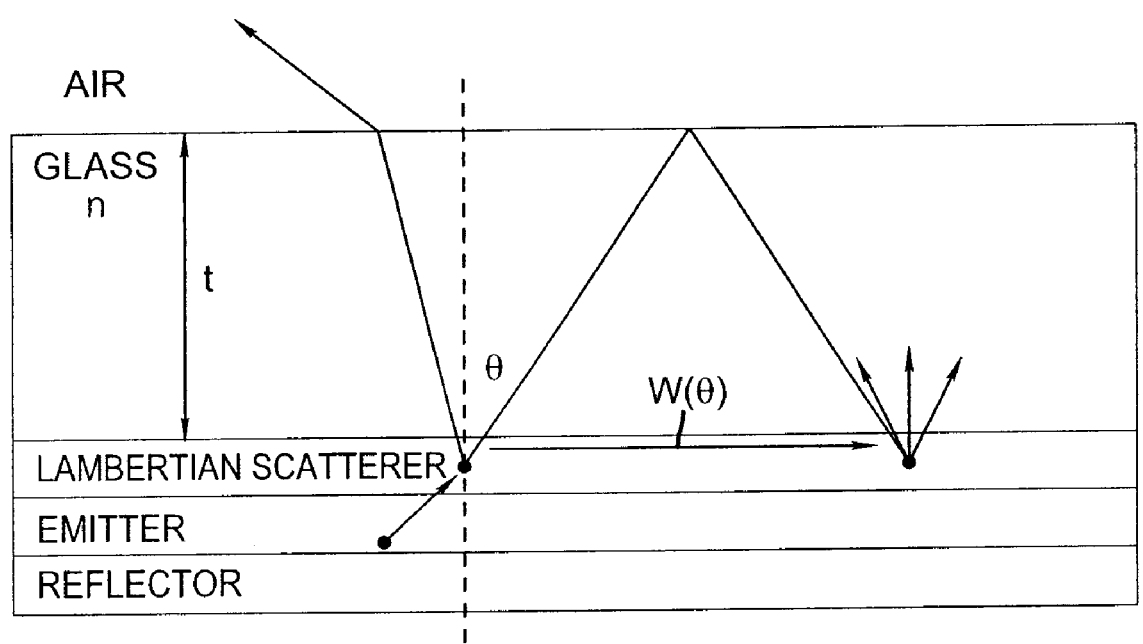
FIG. 18 is a diagram illustrating a model of the light propagation in an OLED device having a scattering layer.

According to the present invention, the brightness of an OLED device is improved while minimizing degradation of the sharpness, by employing a scattering layer in combination with a thin substrate or cover for a bottom- or top-emitter OLED device respectively. The thin substrate or cover reduces the distance light travels laterally through the device after the light is scattered. The following derivation is a simplified analytical model that computes the loss of resolution for a display device with a glass substrate, and a scattering layer located on the device side of the glass. A very precise digital model could be devised using Monte-Carlo methods, the actual properties of the scattering film, and precise optical equations. This analytical model lends itself to a closed form solution, with a few modest approximations, but provides a semi-quantitative, easily interpreted solution. The device to be modeled is shown in FIG. 18 and assumes the following:

An OLED emitter is sandwiched between a reflector, and a Lambertian scattering layer;

The scattering layer is approximately index matched to the glass;

Once light is emitted, it may reflect off of the reflector, but eventually it encounters the scattering layer;

The scattering layer, emitter, and reflector are very thin, so negligible lateral propagation of light occurs in these layers;

There is negligible absorption in the entire structure;

The scattering layer is a Lambertian volumetric scattering element, meaning that the final direction of the scattered light is independent of the initial direction, and the probability of the light being scattered at an angle $\theta$ is proportional to $\cos(\theta)$, and to the solid angle available at angle $\theta$;

The glass substrate is thick compared to the other layers, and on the same order of magnitude as the pixel size;

The glass thickness is t, and the index of refraction of the glass is n;

All emitted light is capable of entering the scattering layer, since the scattering element is in contact with the emitter and, presumably, some of the scattering centers are less than 0.1 times the radiation wavelength from the emitter;

When light strikes the glass-air interface below the critical angle, it is refracted into the air (sub-critical reflection is ignored);

When light strikes the glass-air interface, above the critical angle, it is reflected back into the glass (this is not an assumption);

The Following Terms are Also Defined:

$P_2(\theta)$ is the probability that light impinging on the scattering layer is scattered at an angle $\theta$ in a two-dimensional model;

$P(\theta)$ is the probability that light impinging on the scattering layer is scattered at an angle $\theta$ in a three dimensional model;

$\theta c$ is the critical angle for glass to air;

$F_0$ is the fraction of scattered light which is below the critical angle;

$W(\theta)$ is the lateral propagation of light at an angle $\theta$ (see FIG. 16);

Wa is the average lateral propagation of light each time the light is totally internally reflected.

The model for the device illustrated in FIG. 18 may be solved as follows. Since the source is Lambertian, the scattering probability function is cosine:

$$P_2(\theta)d\theta = \cos(\theta)d\theta \quad\quad 1)$$

In three dimensions, one must integrate over the dihedral angle (there is a larger solid angle at 90 degrees than at 0 degrees):

$$P(\theta)d\theta = 2*\cos(\theta)*\sin(\theta)d\theta \quad\quad 2)$$

The factor 2 was added to normalize the integral of $P(\theta)$ from $\theta=0$ to $\pi/2$. After the first encounter with the scattering layer, a fraction $F_0$ of the scattered light will be below the critical angle, and exit directly to the air without any lateral propagation.

$$F_0 = \int_0^{\theta_C} P(\theta)d\theta = \int_0^{\theta_C} 2*\cos(\theta)*\sin(\theta)d\theta = \sin^2(\theta_C) \quad\quad 3)$$

The critical angle, $\theta_C$, is equal to $\arcsin(1/n)$, so one could rewrite equation 3 as $F_0 = n^{-2}$, but there is no value in doing that at this time. If n for the glass were 1.5, then $F_0$ would be 0.44, indicating that 44% of the scattered light would emerge on the first pass without any lateral propagation. The remaining 56% of the light will totally reflect back to the scattering layer, where it will take on a totally new direction. In this process, the light will be displaced by an amount $W(\theta)$ as shown in FIG. 18. $W(\theta)$ can be determined by simple geometry as:

$$W(\theta) = 2*t*\tan(\theta) \quad\quad 4)$$

In order to simplify the analytical model, the probability-weighted average of the lateral propagation can be calculated as:

$$W_A = \frac{\int_{\theta_C}^{\pi/2} P(\theta)*W(\theta)d\theta}{\int_{\theta_C}^{\pi/2} P(\theta)d\theta} \quad\quad 5)$$

$$W_A = \frac{\int_{\theta_C}^{\pi/2} 2*\cos(\theta)*\sin(\theta)*2*t*\tan(\theta)d\theta}{\int_{\theta_C}^{\pi/2} 2*\cos(\theta)*\sin(\theta)d\theta} \quad\quad 6)$$

$$W_A = t* \frac{[2*\theta - \sin(2\theta)]_{\theta_C}^{\pi/2}}{[\sin^2(\theta)]_{\theta_C}^{\pi/2}} \quad\quad 7)$$

$$W_A = t \frac{\pi - 2\theta_C + \sin(2\theta_C)}{\cos^2(\theta_C)} \quad\quad 8)$$

Having obtained a solution describing the lateral propagation of light in the model of FIG. 18, we can calculate the distance that light travels through the substrate 10 or cover 20 of known thickness in the presence of a scattering layer 22. For the specific case of index 1.5, one can now state that of the 55.6% of the light that is reflected back to the scattering layer, that the average lateral propagation is equal to 4.82*t. Of that light, 44.4% will refract directly to the air with no additional lateral propagation, and 55.6% will again experience lateral propagation of 4.82*t. The second lateral propagation will be at a random angle relative to the first lateral propagation, so the addition will not be linear, but the two will add in quadrature (i.e. square root of the sum of the squares). The following table follows the average lateral propagation and fraction of the light escaping after each total reflection for n=1.5.

| Pass # | Fraction Escaping | Average lateral propagation | Fraction Returning |
|---|---|---|---|
| 1 | 44.44% | 0 t | 55.56% |
| 2 | 24.69% | 4.8 t | 30.87% |
| 3 | 13.72% | 6.8 t | 17.15% |
| 4 | 7.62% | 8.3 t | 9.53% |
| 5 | 3.39% | 9.6 t | 6.14% |

These results are now interpreted and applied to various embodiments of the present invention. Had there been no scattering layer, only about 20% to 30% of the generated light would have escaped, and the average lateral propagation would be 0. The off-axis rays would propagate laterally while traversing the glass substrate, but the viewer's eye is located at a unique value of $\theta$ and all the rays emerging at that angle have exactly the same lateral propagation, so the eye re-creates a precise image. That is why the lateral propagation of light traversing the glass on the first pass can be ignored. The image degradation results from the random direction change which occurs when the light reflects back to the scattering layer. From the table one sees that for this non-absorbing model, 100% of the light generated eventually escapes, but 5 to 10 reflections within the glass are required.

The lateral propagation is proportional to the thickness of the glass, t. Reducing t to the size of the characteristic spacing of the pixel pitch reduces the lateral propagation proportionately. More than half of the escaping light will experience a lateral propagation of nearly 5t, and 10% of the light will propagate laterally by more than 10t. An exact curve of lateral propagation probability versus lateral propagation distance could be calculated using the sophisticated model alluded to above. If a human viewer is sensitive to degradation wherein 50% of the light scatters by twice the pixel pitch then one would desire that the glass have a thickness t which is less than half of the pixel pitch characteristic spacing.

For a real medium with absorption, the amount of light escaping would be reduced, and the amount of image degradation would also be reduced. Furthermore, most scattering layers are not fully Lambertian and suffer from reduced scattering at high angles. This further reduces the magnitude of image degradation. A preferred range for real devices would be a t value equal to the characteristic spacing pixel pitch, that is the thickness of the cover 20 or substrate 10 is the maximum distance between corresponding points in neighboring pixels. An acceptable range of t is less than or equal to twice the pixel pitch, that is the thickness of either the substrate 10 or the cover 20 through which light is emitted is less than or equal to two times the characteristic spacing.

Figure 9:
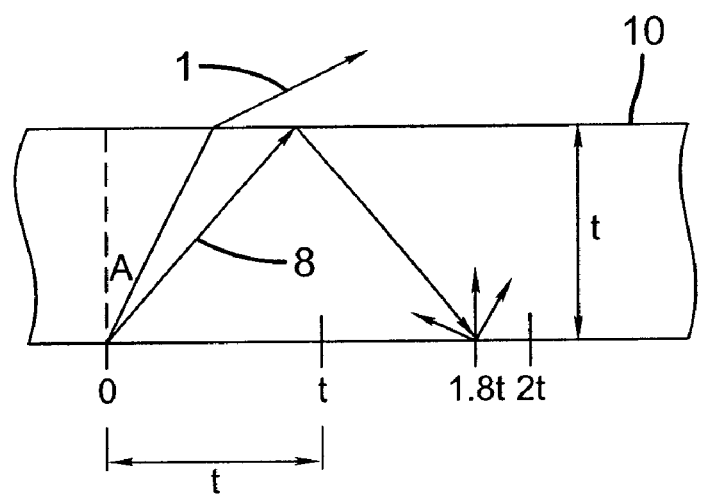
FIG. 9 illustrates light traveling through a cross section of an OLED device according to an embodiment of the present invention.
Figure 10:
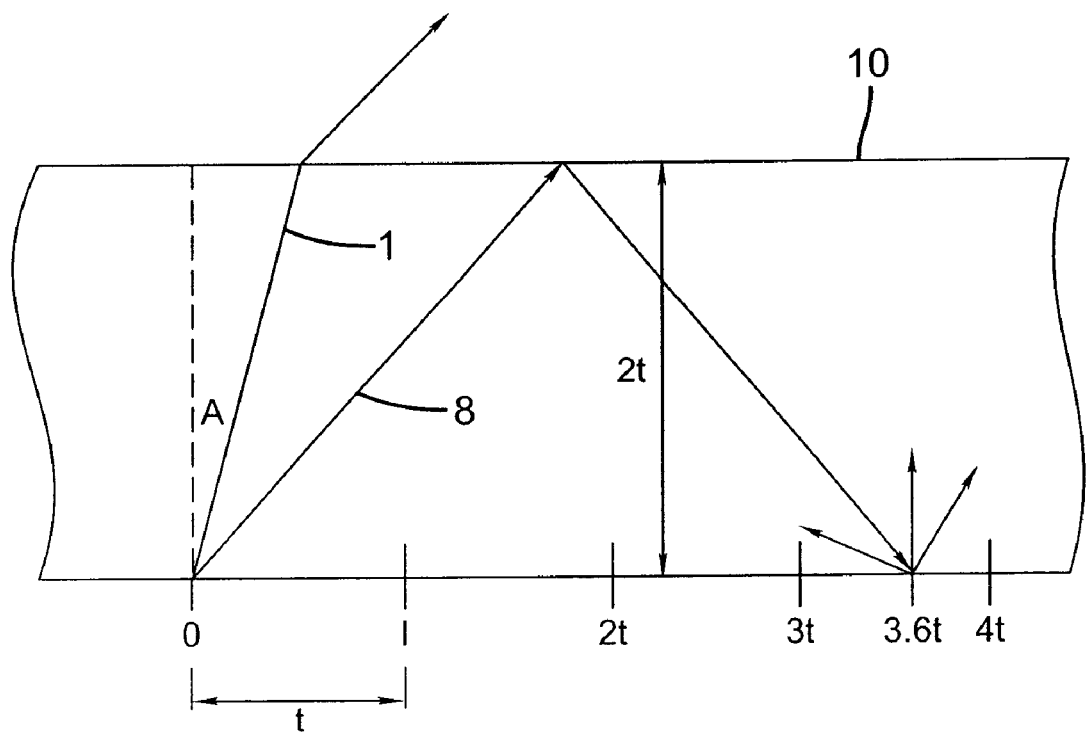
FIG. 10 illustrates emitted light traveling through a cross section of an OLED device according to an embodiment of the present invention.

Referring to FIG. 9, a substrate of thickness t has a light-emitting element with a characteristic spacing of t. Light ray 1 emitted at an angle less than the critical angle of 42 degrees (for a glass substrate) will escape from the substrate 10 while light ray 8 emitted at angles greater than the critical angle will be totally internally reflected, propagate laterally, and strike the substrate interface at a distance of 1.8t or farther (an average of 4.8t farther as calculated above) from the point of emission and be rescattered. Referring to FIG. 10, a substrate of thickness 2t has a light-emitting element with a characteristic spacing of t. In this case, light ray 8 emitted at angles greater than the critical angle will be totally internally reflected, propagate laterally, and strike the substrate interface at a distance of 3.6t or farther (an average of 9.6t farther as calculated above) from the point of emission and be rescattered. Hence, in the model discussion, a thicker substrate 10 or cover 20 will result in greater lateral propagation before being scattered out of the device.

Referring back to FIG. 7, in the illustrated embodiment Dx is larger than Dy and Dx represents the maximum distance between corresponding points of neighboring pixels in an array dimension, the x dimension. This characteristic spacing represents the limit of viewer acceptability in that dimension. However, because the light-emitting elements are much closer in the y dimension, the sharpness in the y dimension will be less than in the x dimension. To further improve performance, according to a particular embodiment of the present invention, the thickness of either the substrate or the cover through which light is emitted is preferably less than or equal to two times the minimum distance between corresponding points of neighboring pixels in an array dimension. This embodiment will maintain the sharpness of the groups of light-emitting elements in both array dimensions.

According to yet another embodiment of the present invention, sharpness can be further improved by limiting the thickness of the cover or substrate to less than or equal to two times the maximum distance between nearest edges of neighboring pixels in an array dimension. In the case of a color display wherein the pixels comprise multiple, differently colored light-emitting elements, a characteristic spacing dependent on corresponding points of neighboring pixels may still allow light of one color emitted by one light-emitting element to be confused with light of another color emitted by a neighboring light-emitting element. For example, red light emitted from one pixel can be confused with blue light from a neighboring pixel. This is illustrated in FIG. 7 with distances Ex in the x dimension and Ey in the y dimension. To help prevent this, the thickness of either the substrate or the cover through which light is emitted is less than or equal to two times the maximum distance between nearest edges of neighboring pixels in an array dimension.

As noted above, employing the maximum distance in any dimension reduces sharpness in another dimension. Hence, in a further embodiment, the thickness of either the substrate or the cover through which light is emitted is less than or equal to two times the minimum distance between nearest edges of neighboring pixels in an array dimension.

The present invention employs a restriction on thickness of the substrate or cover through which light is emitted of less than or equal to two times the characteristic spacing. However, as noted above, this represents a minimum for acceptability. For applications with more stringent requirements, it may be preferred to reduce the loss of sharpness by requiring that the thickness of either the substrate or the cover through which light is emitted is less than or equal to the characteristic spacing, as illustrated in FIG. 9. This would maintain the sharpness of the device to a level much closer to the resolution limit of the display device. In a further preferred embodiment, it may be preferred to reduce the loss of sharpness by requiring that the thickness of either the substrate or the cover through which light is emitted is less than or equal to half of the characteristic spacing (not shown).

In both passive- and active-matrix OLED devices, the light-emitting areas of the light-emitting elements do not completely cover the display area of the device. For example, bus line, transistors, and manufacturing tolerance limitations can all reduce the relative size of the light-emitting areas in comparison to the overall display area. This relative size is known as the fill factor (or aperture ratio) of the device. Bottom-emitting OLED devices commercially available from the Eastman Kodak Company are known to have fill factors between 30% and 40%. Top-emitter displays are expected to have higher fill factors while passive-matrix devices (because they have no active components) may have the highest fill factor of all. Typically, a high fill factor is preferred because it increases the light-emitting area of the device, increasing brightness and lifetime which decreasing current density. However, a lower fill factor can improve the relative sharpness of the display, but will reduce the brightness enhancement of a scattering layer. For example, an additional light ray 7 is illustrated in FIG. 16 for a 50% fill factor device in comparison to the 100% fill factor of FIG. 9. As illustrated in FIG. 16, the extent to which the light is spread over the surface of the neighboring elements is somewhat reduced, from a minimum of 1.82.8t to 1.8-2.3t for light rays emitted at the critical angle from a given point on the substrate. However, the improvement is relatively limited. Even if the fill factor was very small and light was only emitted at one point, the extent to which the light is spread over the surface of the neighboring elements cannot be reduced to less than 1.8t, since that distance is determined by the relative indices of refraction of the materials and the thickness of the substrate or cover.

The present invention provides improved sharpness by reducing the thickness of the cover or substrate, thereby reducing the distance that light propagates through the cover or substrate before (re)encountering the scattering layer. While light may also propagate through the organic layers and transparent electrode, because these layers are relatively very thin, light will be scattered before it travels far. If a scattering layer is external to the organic layers and transparent electrodes, the angle at which it escapes from the organic layers and electrode may not be limited by the relative indices of refraction, but by the scattering properties of the scattering layer. In this case, if the scattering layer is adjacent to the substrate or cover, as illustrated, e.g., in FIGS. 5 and 6, light may be passed into the substrate or cover over a wider range of angles, thereby further reducing the sharpness of the display. To compensate for this, further restrictions on the thickness of the cover or substrate may be employed.

Figure 11:
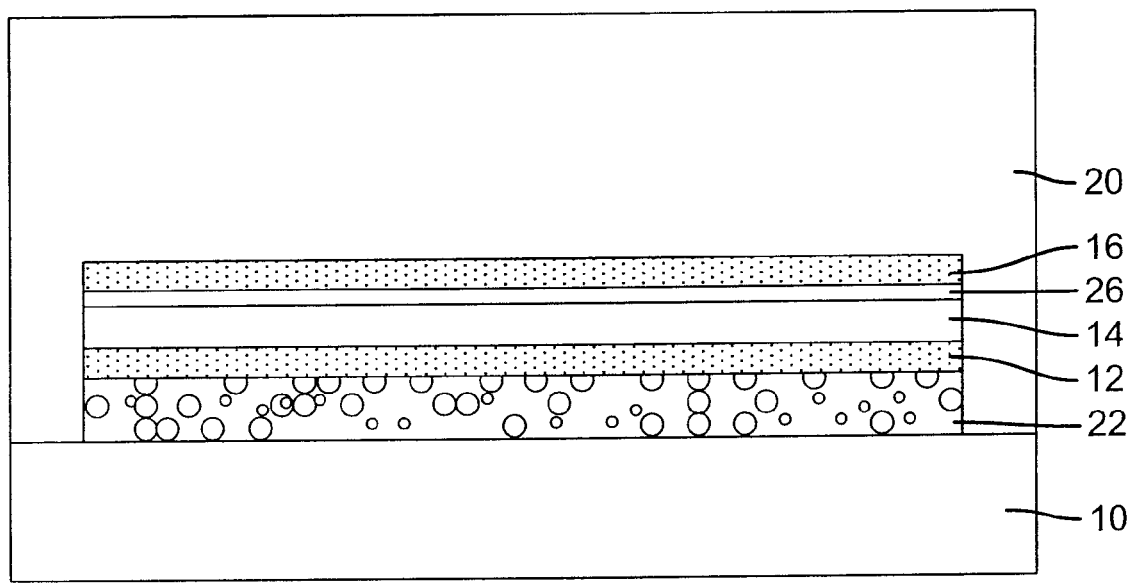
FIG. 11 illustrates a cross section of a bottom-emitter OLED device having a short reduction layer according to an embodiment of the present invention.
Figure 12:
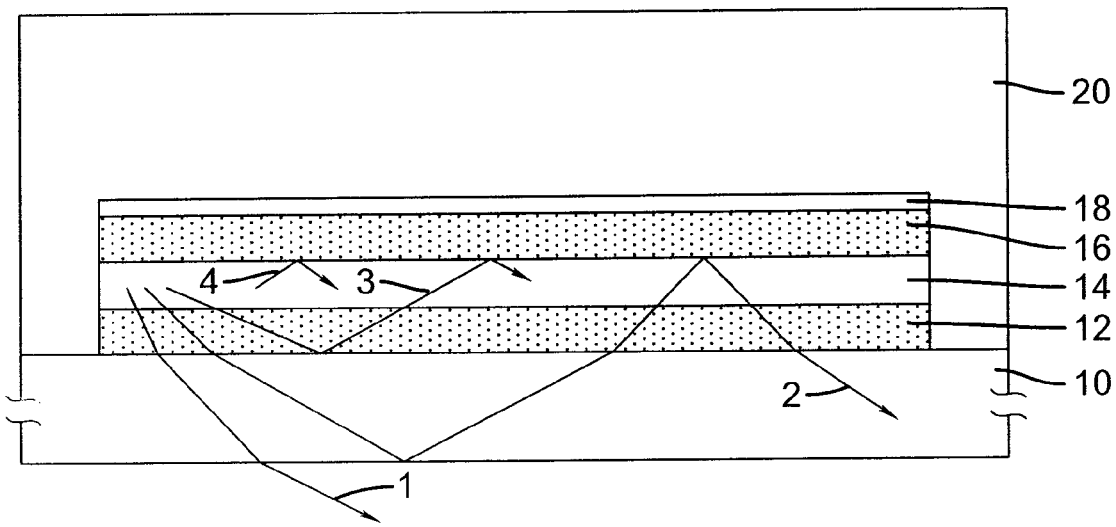
FIG. 12 illustrates a cross section of a prior-art bottom-emitter OLED device.
Figure 13:
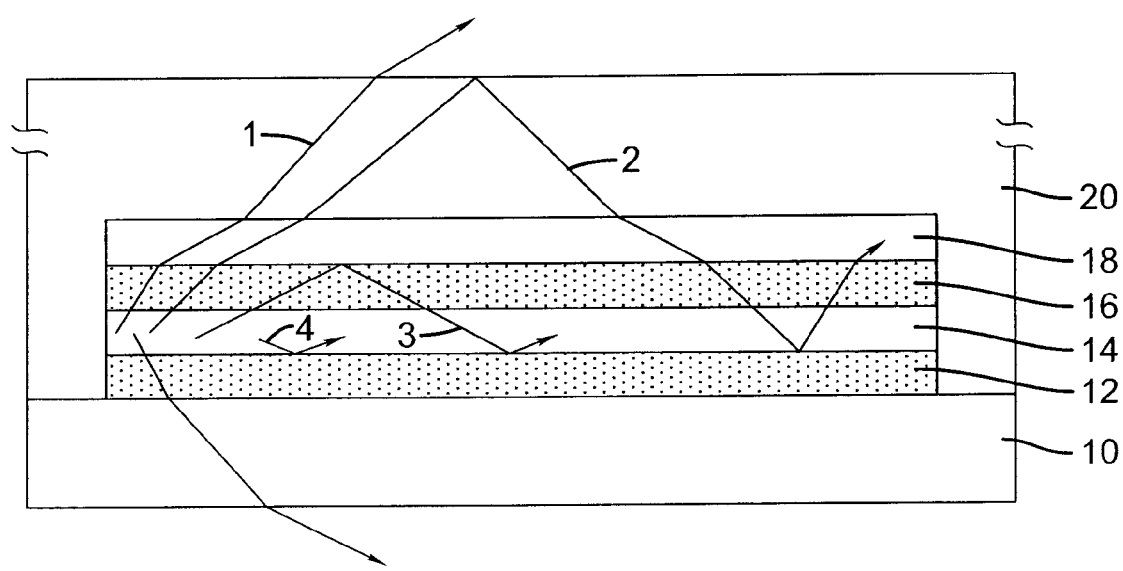
FIG. 13 illustrates a cross section of a top-emitter OLED device as proposed in the art.
Figure 14:
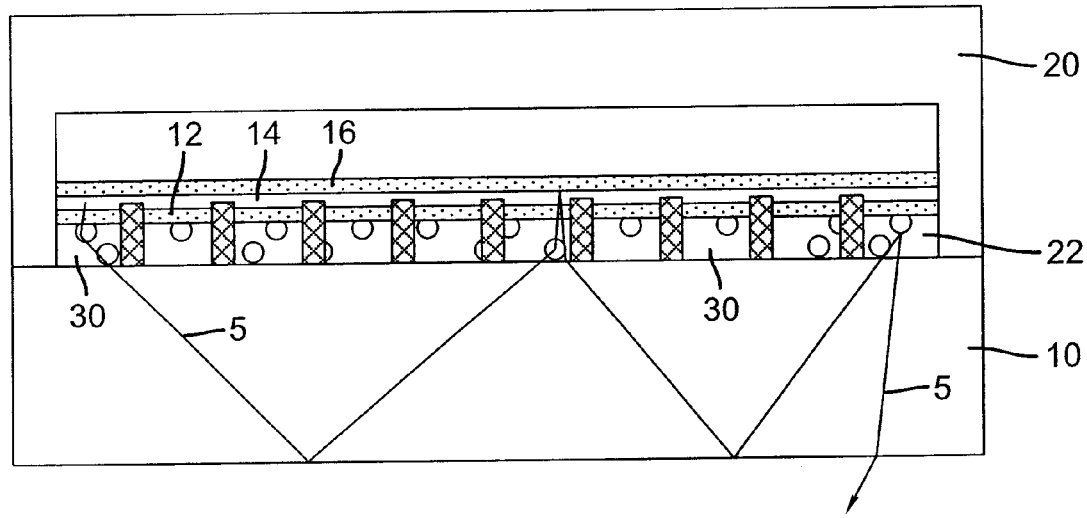
FIG. 14 illustrates a cross section of a bottom-emitter OLED device as proposed in the art.
Figure 15:
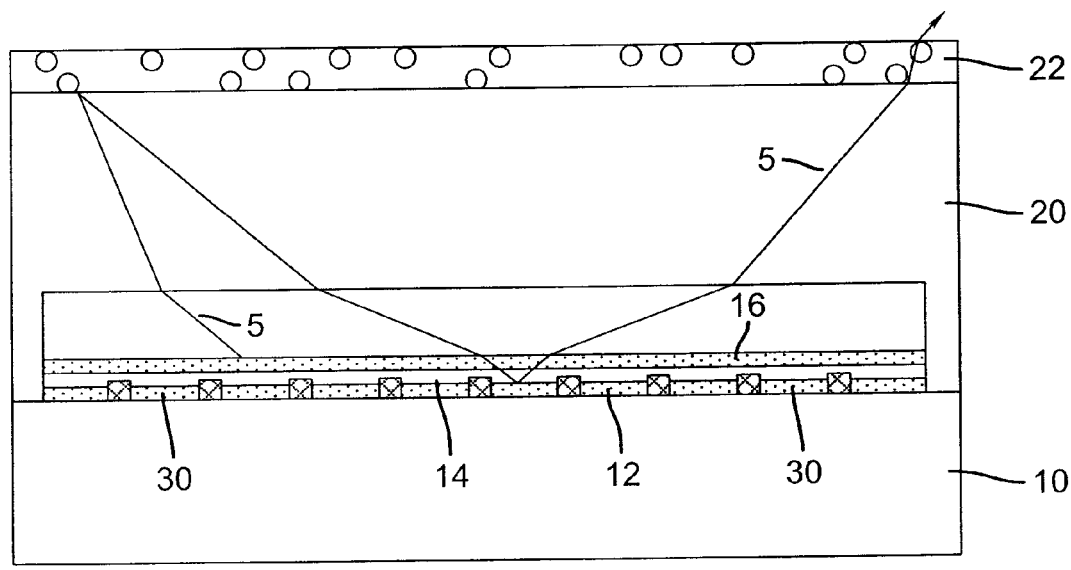
FIG. 15 illustrates a cross section of a top-emitter OLED device having a scattering layer as proposed in the art.

One problem that may be encountered with such scattering layers is that the electrodes 12 and 16 may tend to fail at sharp edges associated with the scattering elements in the layer 22. Although the scattering layer may be planarized, typically such operations do not form a perfectly smooth, defect-free surface. To reduce the possibility of shorts between the first and second electrodes 12 and 16, a short-reduction layer 26 may be employed between the electrodes, as illustrated in FIG. 11. Such a layer is a thin layer of high-resistance material (for example having a through-thickness resistivity between $10^{-7}$ ohm-$cm^2$ to $10^3$ ohm-$cm^2$). Because the short-reduction layer is very thin, device current can pass between the electrodes through the device layers but leakage current through the shorts are much reduced. Such layers are described in co-pending, commonly assigned U.S. Ser. No. 10/822,517, filed Apr. 12, 2004, the disclosure of which is incorporated herein by reference.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890 issued May 8, 2001 to Boroson et al. In addition, barrier layers such as $SiO_x$ (x>1), Teflon, and alternating inorganic/polymeric layers are known in the art for encapsulation.

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

PARTS LIST 1, 2, 3, 4, 5, 6, 7, 8 light rays
10 substrate
11 thickness
12 first electrode
14 organic layer(s)
16 second electrode
18 gap
20 encapsulating cover
21 thickness
22 scattering layer
26 short reduction layer
30 pixel
31 characteristic spacing
32 light emitting area
40 pixel
50, 52 materials of different refractive indices
100 red sub-pixel
102 green sub-pixel
104 blue sub-pixel

The invention claimed is:

1. A flat-panel, organic light-emitting diode (OLED) pixellated display device, comprising:
   a) a substrate having a substrate thickness;
   b) an array of pixels comprising one or more OLED light-emitting elements, each light emitting element having a first electrode formed over the substrate, one or more layers of organic light-emitting material formed over the first electrode, and a second electrode formed over the layer(s) of organic light-emitting material to define a light-emitting area; the array of pixels having a characteristic spacing between neighboring pixels in the array, wherein the characteristic spacing is the maximum distance between corresponding points in neighboring pixels in an array dimension;
   c) a cover located over the substrate having a cover thickness; and
   d) a scattering layer located between the substrate and the cover;
   wherein light from the OLED light-emitting elements is emitted either through at least one of the substrate or the cover, and wherein the thickness of either the substrate or the cover through which light is emitted is less than or equal to two times the characteristic spacing.

2. The OLED device of claim 1, wherein the scattering layer is located between the substrate and first electrode, between an electrode and the layer(s) of organic material, or between an electrode and the cover.

3. The OLED device of claim 1, wherein the scattering layer is adjacent to and in contact with an electrode.

4. The OLED device of claim 1, wherein the cover is a transparent cover through which light from the OLED is emitted.

5. The OLED device of claim 1, wherein the substrate is a transparent substrate through which light from the OLED is emitted.

6. The OLED device of claim 1, wherein the cover or the substrate through which light from the OLED light-emitting elements is emitted comprises glass or plastic.

7. The OLED device of claim 1, wherein the light scattering layer is an electrode.

8. The OLED device of claim 1, wherein the OLED is an active-matrix device.

9. The OLED device of claim 1, wherein the OLED is a passive-matrix device.

10. The OLED device of claim 1, wherein the substrate and/or cover are flexible.

11. The OLED device of claim 1, wherein the second electrode or one or more of the layer(s) of organic light-emitting material is common to all light-emitting elements.

12. The OLED device of claim 1, wherein the pixels comprise a plurality of differently-colored light-emitting elements.

13. The OLED device of claim 1, wherein the thickness of either the substrate or the cover through which light is emitted is less than or equal to two times the minimum distance between corresponding points in neighboring pixels in an array dimension.

14. The OLED device of claim 1, wherein the thickness of either the substrate or the cover through which light is emitted is less than or equal to two times the maximum distance between nearest edges of neighboring pixels in an array dimension.

15. The OLED device of claim 1, wherein the thickness of either the substrate or the cover through which light is emitted is less than or equal to two times the minimum distance between nearest edges of neighboring pixels in an array dimension.

16. The OLED device of claim 1, wherein the thickness of either the substrate or the cover through which light is emitted is less than or equal to the characteristic spacing.

17. The OLED device of claim 1, wherein the thickness of either the substrate or the cover through which light is emitted is less than or equal to one half of the characteristic spacing.

18. The OLED device of claim 1, wherein a short reduction layer is disposed at some position between the two electrodes.

* * * * *

UNITED STATES PATENT AND TRADEMARK OFFICE
CERTIFICATE OF CORRECTION

PATENT NO. : 7,276,848 B2  Page 1 of 1
APPLICATION NO. : 11/093243
DATED : October 2, 2007
INVENTOR(S) : Ronald S. Cok et al.

It is certified that error appears in the above-identified patent and that said Letters Patent is hereby corrected as shown below:

Title Page, item (57)
Abstract, line 1, "pillaged" should read --pixellated--

Signed and Sealed this

Second Day of December, 2008

JON W. DUDAS
*Director of the United States Patent and Trademark Office*